US008635573B2

(12) United States Patent
Chuang et al.

(10) Patent No.: US 8,635,573 B2
(45) Date of Patent: Jan. 21, 2014

(54) METHOD OF FABRICATING A SEMICONDUCTOR DEVICE HAVING A DEFINED MINIMUM GATE SPACING BETWEEN ADJACENT GATE STRUCTURES

(75) Inventors: Hak-Lay Chuang, Singapore (SG); Ming Zhu, Singapore (SG); Po-Nien Chen, Miaoli (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 13/195,628

(22) Filed: Aug. 1, 2011

(65) Prior Publication Data

US 2013/0032884 A1 Feb. 7, 2013

(51) Int. Cl.
*G06F 17/50* (2006.01)
*H01L 21/3205* (2006.01)

(52) U.S. Cl.
USPC ........... 716/122; 716/110; 716/111; 716/118; 716/119; 438/587; 438/588

(58) Field of Classification Search
USPC .......... 438/587–588; 716/110–111, 118–119, 716/122
See application file for complete search history.

(56) References Cited

U.S. PATENT DOCUMENTS

| | | | | |
|---|---|---|---|---|
| 3,725,897 A * | 4/1973 | Bleiweiss | ....................... | 345/16 |
| 3,909,831 A * | 9/1975 | Marchio et al. | ............. | 346/140.1 |
| 6,205,570 B1 * | 3/2001 | Yamashita | .................... | 716/113 |
| 6,239,788 B1 * | 5/2001 | Nohno et al. | ................. | 345/173 |
| 6,828,634 B2 * | 12/2004 | Oshima | ......................... | 257/369 |
| 7,275,230 B2 * | 9/2007 | Gentry et al. | ................. | 716/139 |
| 7,785,971 B1 * | 8/2010 | Bulucea et al. | ............... | 438/290 |
| 7,792,663 B2 * | 9/2010 | Ikoma et al. | ....................... | 703/2 |
| 7,902,673 B2 | 3/2011 | Wang | | |
| 8,261,225 B2 * | 9/2012 | Toubou et al. | ................ | 716/122 |
| 2003/0031331 A1 * | 2/2003 | Harris et al. | .................. | 381/152 |
| 2004/0218390 A1 * | 11/2004 | Holman et al. | ............... | 362/245 |
| 2004/0243947 A1 * | 12/2004 | Liu et al. | ........................... | 716/1 |
| 2005/0133859 A1 * | 6/2005 | Kuwahara et al. | ............ | 257/328 |
| 2005/0167843 A1 * | 8/2005 | Ishida et al. | ................... | 257/758 |
| 2005/0173151 A1 * | 8/2005 | Shepherd et al. | ............. | 174/250 |
| 2005/0271949 A1 * | 12/2005 | Corboy et al. | .................... | 430/5 |
| 2006/0267059 A1 * | 11/2006 | Yu et al. | ........................ | 257/296 |
| 2007/0061770 A1 * | 3/2007 | Kobayashi | ...................... | 716/13 |
| 2007/0074410 A1 * | 4/2007 | Armstrong et al. | ............. | 33/286 |
| 2008/0036089 A1 * | 2/2008 | Ishida et al. | ................... | 257/751 |
| 2010/0053358 A1 * | 3/2010 | Kodama | ..................... | 348/222.1 |

(Continued)

OTHER PUBLICATIONS

Math Open Reference, "Math Open Reference 3:4:5 Triangle", 2009, obtained on Mar. 18, 2013 by http://www.mathopenrefernce.com/triangle345.html pp. 1-3.*

*Primary Examiner* — Stacy Whitmore
(74) *Attorney, Agent, or Firm* — Haynes and Boone, LLP

(57) ABSTRACT

A device, and method of fabricating and/or designing such a device, including a first gate structure having a width (W) and a length (L) and a second gate structure separated from the first gate structure by a distance greater than: ($\sqrt{W*W+L*L}$)/10. The second gate structure is a next adjacent gate structure to the first gate structure. A method and apparatus for designing an integrated circuit including implementing a design rule defining the separation of gate structures is also described. In embodiments, the distance of separation is implemented for gate structures that are larger relative to other gate structures on the substrate (e.g., greater than 3 $\mu m^2$).

18 Claims, 7 Drawing Sheets

(56) References Cited

U.S. PATENT DOCUMENTS

| | | |
|---|---|---|
| 2010/0094607 A1* | 4/2010 | Shepherd et al. ............... 703/2 |
| 2010/0148235 A1* | 6/2010 | Toubou et al. ............... 257/296 |
| 2010/0155856 A1* | 6/2010 | Kim ............................ 257/392 |
| 2010/0272895 A1* | 10/2010 | Tsuda ...................... 427/255.32 |
| 2012/0007172 A1* | 1/2012 | Kim ............................ 257/330 |
| 2012/0043610 A1* | 2/2012 | Cheng et al. ................. 257/347 |
| 2012/0149200 A1* | 6/2012 | Culp et al. .................... 438/696 |
| 2012/0223394 A1* | 9/2012 | Toh et al. ..................... 257/384 |
| 2012/0244681 A1* | 9/2012 | Grivna et al. ................ 438/462 |
| 2012/0261765 A1* | 10/2012 | Beyer et al. ................... 257/369 |
| 2012/0307569 A1* | 12/2012 | Kamath et al. ........... 365/185.29 |
| 2012/0320427 A1* | 12/2012 | Zheng et al. ................. 358/3.26 |
| 2013/0017679 A1* | 1/2013 | Lenski et al. ................ 438/591 |

* cited by examiner

METHOD OF FABRICATING A SEMICONDUCTOR DEVICE HAVING A DEFINED MINIMUM GATE SPACING BETWEEN ADJACENT GATE STRUCTURES

BACKGROUND

The following disclosure relates generally to integrated circuit (IC) devices, and to methods and apparatus for the design and fabrication of IC devices.

As technology progresses and IC devices include smaller dimensions and increased feature density. As technology nodes shrink, challenges are raised for example, mismatch of device performance becomes more critical. However, for relatively larger devices typically required in system-on-a-chip (SOC), analog, digital signal processing (DSP) and radio frequency (RF) applications, it may be difficult to provide adequate matching of large devices in an IC. These device mismatch issues may arise from the replacement or gate-last methodology employed to provide metal gate technology. The gate-last methodology typically requires additional chemical mechanical processing (CMP) steps. These CMP processes can create differences in gate heights due to loading effects. These loading effects are often exacerbated by the use of large devices (e.g., in concert with smaller features). For example, CMP dishing can result which may result in metal work-function shifts and mismatch degradation of the IC.

Thus, what is needed is an improved manner of circuit design, fabrication and implementation for gate last processes of ICs including differently sized devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
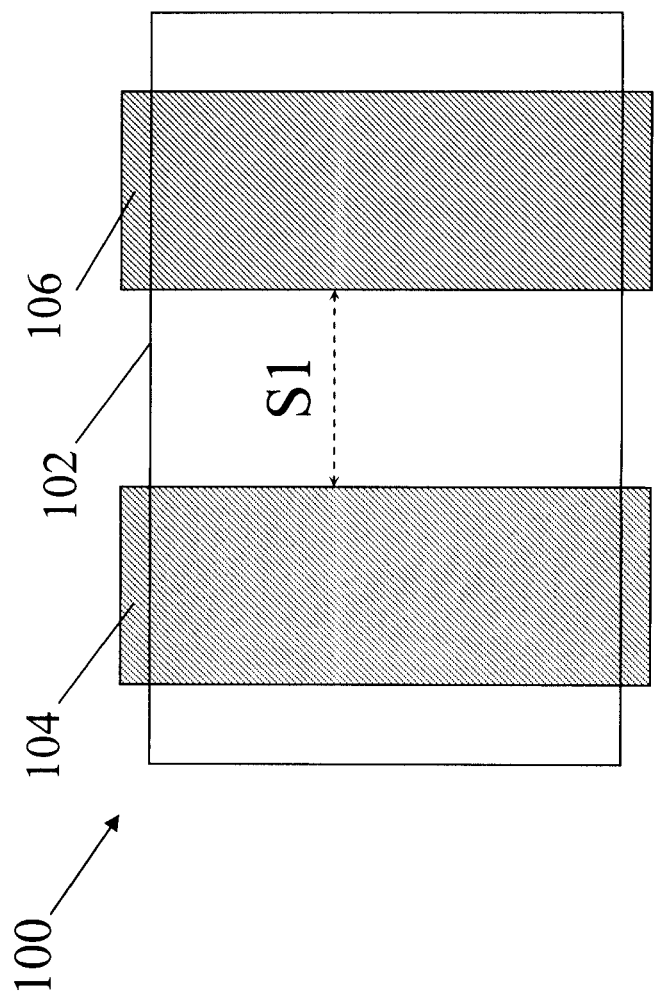
FIG. 1 is an embodiment of a pattern corresponding to one or more aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, on or adjacent a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as, but not limited to "below," "above," "upper", "right", "left", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures; that is, they are relative only and not intended to imply an absolute direction. For example, if the device in the figures is turned over, elements described as being "below" other elements or features would then be oriented "above" the other elements or features. Thus, the exemplary term "below" can encompass both an orientation of above and below.

The following "patterns" described herein may be implemented in various fashions as described below with reference to FIG. 1. Namely, they may be provided as fabricated features on a semiconductor device, fabricated features on a semiconductor wafer prior to completion of fabrication processes, features formed on a photomask (or reticle) used to fabricate devices, "features" of a device defined in design data such as layout files, and/or other suitable means. Similarly, a feature of a pattern that "defines" a portion of an IC may provide the physical structure of the IC (e.g., be a gate electrode or dummy gate electrode), represent design data associated with the physical structure of the IC, represent a feature formed on a photomask used to form the physical structure of the IC, and/or other suitable embodiments.

Thus, the present embodiments (e.g., patterns) can take the form of an entirely hardware or tangible embodiment, an entirely software embodiment, or an embodiment containing both hardware and software elements. Furthermore, embodiments of the present disclosure can take the form of a computer program product accessible from a tangible computer-usable or computer-readable medium providing program code or data for use by or in connection with a computer or any instruction execution system, such as discussed below. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Referring to FIG. 1, illustrated is a pattern 100. The pattern 100 includes an active area 102, a first feature 104, and a second feature 106. The pattern 100 may be formed on one or more substrates. The substrate may include a semiconductor substrate (e.g., wafer), or one or more photomask substrates, as discussed below. Alternatively and/or additionally, the pattern 100 may be provided as data representing an IC design or portion thereof (e.g., layout).

In an embodiment, the substrate upon which the pattern 100 is disposed is a semiconductor wafer. In other embodiments, the substrate may include a substrate of a semiconductor device, after dicing the wafer. The substrate may include silicon. Alternatively, the substrate may include germanium, or include a compound semiconductor such as, silicon carbide, gallium arsenide, indium arsenide, or indium phosphide. Various other substrate materials may be suitable including those typically used in the semiconductor device fabrication processes. Various isolation features may be formed in substrate interposing various doped regions (e.g., n-wells and p-wells) formed in various active regions, such as region 102. In an embodiment, the features 104 and/or 106 include gate structures (e.g., polysilicon features) formed on the semiconductor substrate. The features 104 and/or 106 may form the gate of resultant IC, or alternatively, may be dummy gate structures which are subsequently replaced with a metal gate structure in a replacement gate or "gate-last" fabrication process.

In an embodiment, the pattern 100 is disposed on one or more photomask substrates (or reticles). The substrate may be a transparent substrate such as fused silica ($SiO_2$), or quartz, relatively free of defects, calcium fluoride, or other suitable material. The photomask substrate may be an attenuating phase shift mask (att-PSM), an alternating PSM (alt-PSM), a chromeless phase shift mask (CPL), and/or other suitable mask types. For example, the photomask substrate may include attenuating material defining the pattern including features 104 and 106; the attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combinations thereof.

In other embodiments, the pattern 100 is provided by data representing an IC design or portion thereof. The pattern 100 may be provided as design layout data stored in one or more design layout databases. The pattern 100 may include a design of one or more layers of an IC device. For example, the pattern 100 may include a pattern or features for an active layer (e.g., active area 102), a polysilicon layer (e.g., features 104, 106), contact/via layers, interconnect layers, etc. The design data including the pattern 100 may be in any suitable file format such as, for example, GDSII, write file format (e.g., MEBES), and/or other now known or later developed formats.

In an embodiment, the first feature 104 and/or the second feature 106 define gate structures. In a further embodiment, the first feature 104 and/or the second feature 106 define polysilicon gate features. For example, the first feature 104 and/or the second feature 106 define polysilicon gate features. These polysilicon gate features may be included in a resultant IC, or may be further processed to processed to form metal gate structures in a replacement gate (or "gate-last") process. The first feature 104 and/or second feature 106 may be gate structures associated with a gate of a transistor of an integrated circuit providing a system-on-a-chip (SOC), analog, digital signal processing (DSP), radio frequency (RF), and/or other applications. The second feature 106 is the next adjacent gate feature to the first feature 104, and vice-versa, in the pattern 100. In other words, there is no gate feature that interposes the first feature 104 and the second feature 106.

The features 104 and 106 are spaced a distance S1. In an embodiment, S1 is referred to as a poly-to-poly spacing, defining a spacing between polysilicon feature 104 and polysilicon feature 106. In an embodiment, a dielectric (e.g., inter-layer dielectric (ILD)) is disposed between feature 104 and 106, including in the spacing S1 (or portion thereof). In an embodiment, the spacing S1 is approximately 500 nm. Further exemplary spacing S1 dimensions are described below with reference to FIG. 3 and its discussion of spacing S3. The spacing S1 may be provided by design rules associated with the pattern 100.

The pattern 100 may be advantageous in that the spacing S1 between polysilicon features 104 and 106 is increased from a typical design. This allows for a larger ILD (e.g., oxide) region beside and between the main features 104 and 106. This larger region of ILD may prevent and/or reduce the non-uniform affects of chemical mechanical polishing (CMP) processes on the features 104 and 106. For example, in an embodiment, the features 104 and 106 are dummy polysilicon gate features. In a replacement gate process, CMP processes are used to form the dummy polysilicon gate features and the subsequent metal gate features. CMP processes that do not provide sufficient uniformity in their planarization can cause differences in the gate heights (e.g., height of features 104 and/or 106). This can lead to device mismatch. For example, the device associated with the feature 104 can provide a different performance than the device associated with the feature 106. This is particularly apparent where the features 104 and 106 define relatively larger gate sizes than that of other gate structures formed on the substrate. A larger gate size may being a feature 104 having an area of greater than approximately 3 µm.

Figure 2:
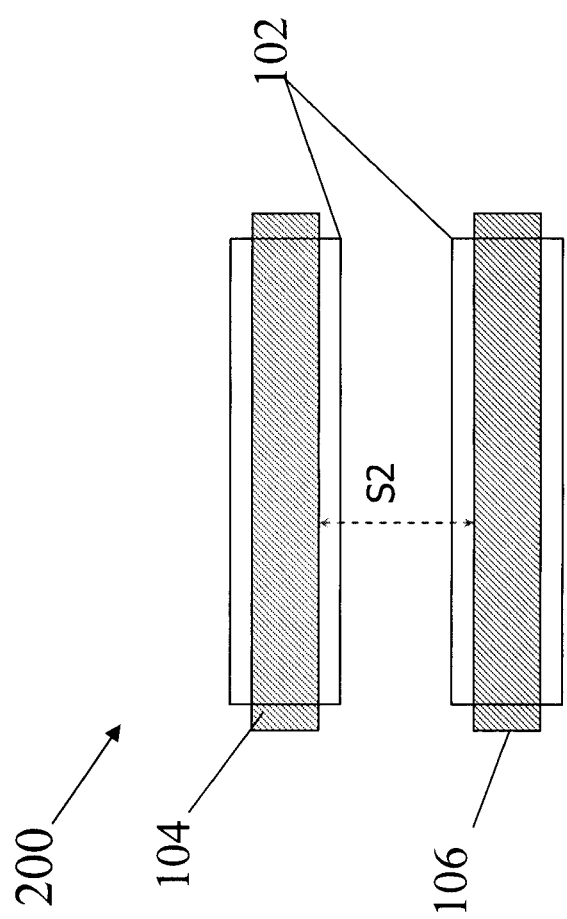
FIG. 2 is another embodiment of a pattern corresponding to one or more aspects of the present disclosure.

Referring now to FIG. 2, illustrated is a pattern 200 including active areas 102, feature 104, and feature 106. The pattern 200 may be substantially similar to the pattern 100, discussed above with reference to FIG. 1, except for the differences in configuration (e.g., active areas 102) evident from FIG. 2. The features 104 and/or 106 may define gate structures. In an embodiment, the features 104 and/or 106 define or provide polysilicon gate structures. The features 104 and 106 are spaced a distance S2 from one another. The distance S2 may be substantially similar to the spacing S1, discussed above with reference to FIG. 1. For example, in an embodiment, S2 is approximately 500 nm. Further exemplary spacing S1 dimensions are described below with reference to FIG. 3 and its discussion of spacing S3.

Figure 3:
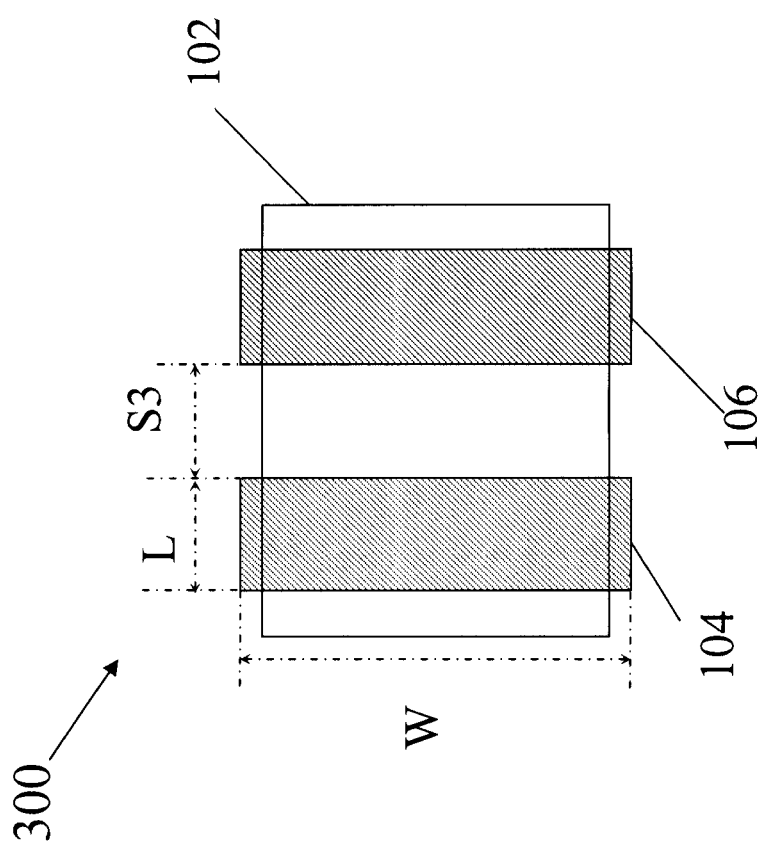
FIG. 3 is an embodiment of the pattern of FIG. 1 illustrating dimensional relationships.

Referring now to FIG. 3, illustrated is a pattern 300 including active area 102, feature 104, and feature 106. The pattern 300 may be substantially similar to the pattern 100 and is illustrated herein to further describe the determination and/or implementation of the spacing between features 104 and 106. The discussion of FIG. 3 is applicable to the spacing S1 of the pattern 100, illustrated in FIG. 1, as well as the distance S2 of the pattern 200, illustrated in FIG. 2.

The feature 104 has a width W and a length L. In an embodiment, W*L is greater than approximately 3 $\mu m^2$. In an embodiment, W*L is less than or equal to approximately 10 $\mu m^2$. The feature 106 may include substantially similar dimensions as the feature 104. In other embodiments, the feature 106 may be a smaller device size (e.g., have an area of less than approximately 3 $\mu m^2$).

The spacing S3 may be defined by design rules associated with the pattern 300, the associated IC, and/or the associated fabrication process. The spacing S3 provides the distance between the features 104 and 106 in the direction of the shortest dimension of the feature 104. As illustrated in FIG. 3, the spacing S3 is provided in the L direction, which is the shorter of the sides of features 104. In other words, if W>L (as illustrated in FIG. 3), then S3 is defined in the L direction. However, if W<L, then the spacing S3 is defined in the W direction.

The spacing S3 may additionally or alternatively be defined by the following equation (1):

$$\text{Spacing }(S3) > \frac{\sqrt{W*W + L*L}}{10} \quad (1)$$

In an embodiment, the spacing S3 is defined as a maximum of 500 nm according to equation (2):

$$\text{Spacing}(S3) \leq 500 \text{ nm} \quad (2)$$

Figure 4:
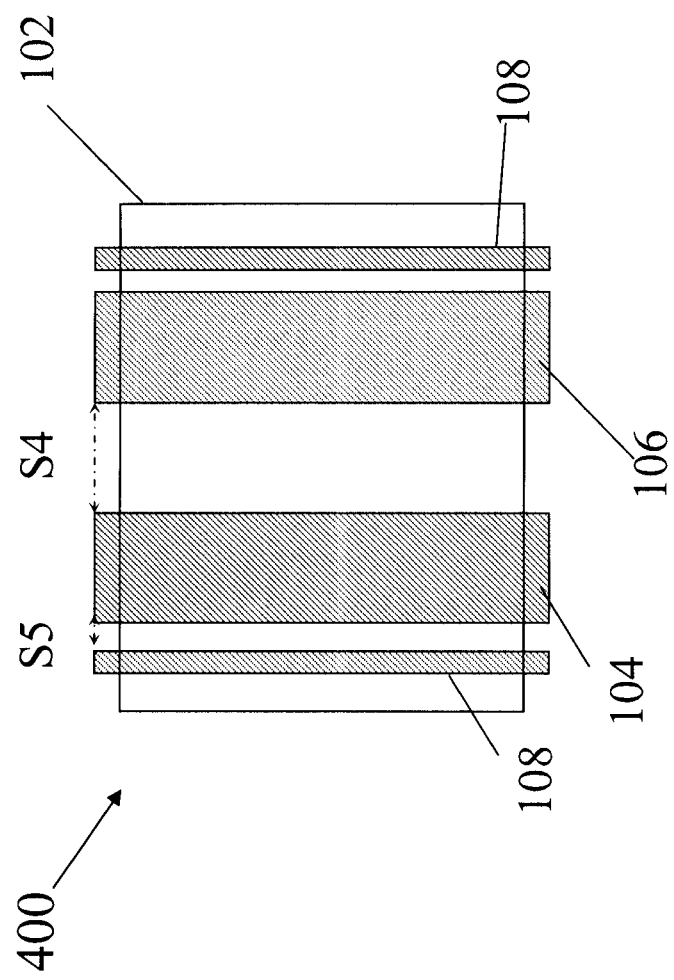
FIG. 4 is an embodiment of a third pattern corresponding to one or more aspects of the present disclosure.

Referring now to FIG. 4, illustrated is a pattern 400. The pattern 400 includes an active area 102, a first feature 104, a second feature 106, and a plurality of smaller features 108. In an embodiment, the area of feature 104 and/or the area of feature 106 is greater than approximately 3 µm². In an embodiment, the area of feature 104 and/or the area of feature 106 is less than approximately 10 µm². In an embodiment, the area of each of the features 108 is less than approximately 3 µm². The pattern 400 may be substantially similar to the patterns 100, 200, and/or 300, described above with reference to FIGS. 1, 2 and 3 respectively. The features 104, 106, and 108 may define gate structures for an integrated circuit. The features 104 and 106 may provide a larger device (e.g., larger gate), while features 108 provide a smaller device (e.g., smaller gate).

The pattern 400 illustrates a spacing S4 between features 104 and 106. The spacing S4 may be substantially similar to the spacing S3 (or S2 or S1), described above with reference to FIG. 3. The spacing S4 may be defined by equation (1) and/or equation (2), discussed above. The pattern 400 also includes a spacing S5 between features 104 and 108. The spacing S5 may be defined by different design rules than that of S4. The spacing S5 may be less than that of S4. In an embodiment, the spacing S5 is between approximately 100 nm and approximately 200 nm. The spacing S5 may not be limited by equation (1).

Thus, pattern 400 illustrates that in an embodiment, increased spacing between relatively larger gate structures, features 104 and 106, is required at only one side of the gate structure. The opposing side of the gate structure, or feature 104 and/or 1061, may be spaced a smaller distance (e.g., S5) from the next adjacent gate structure (e.g., feature 108).

Figure 5:
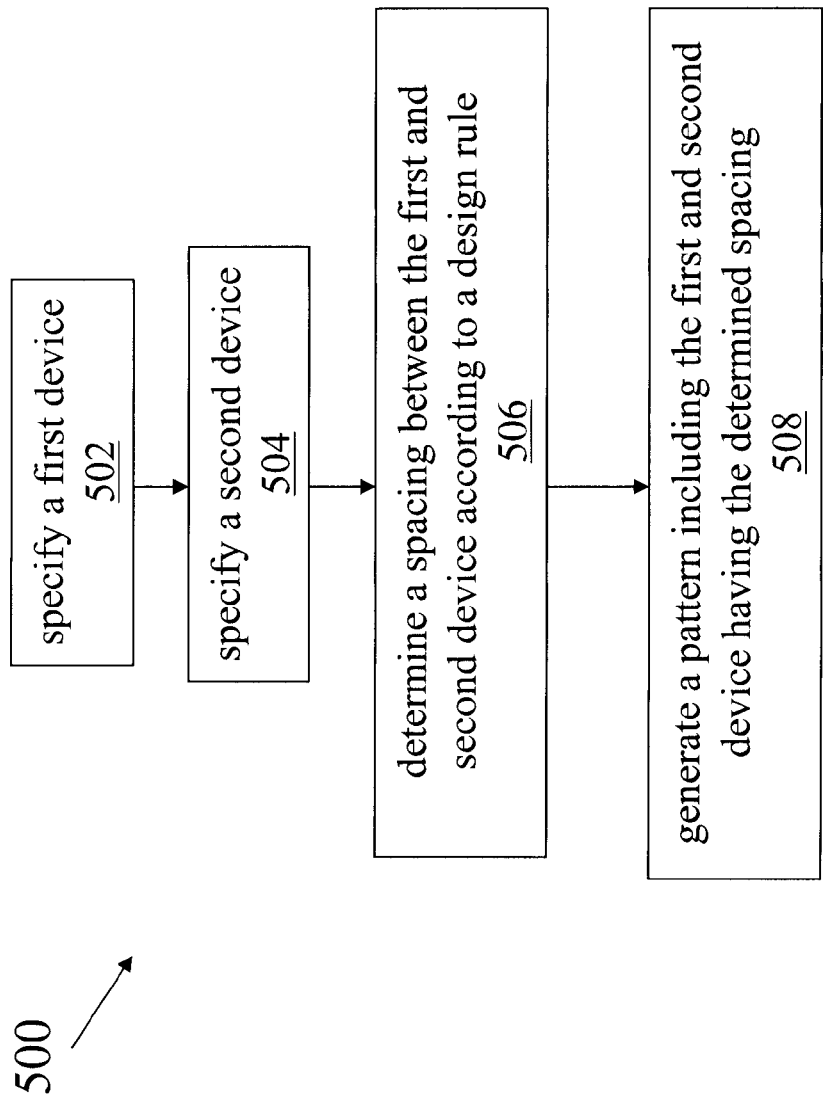
FIG. 5 is a flow chart illustrating an embodiment of a method of IC design according to one or more aspects of the present disclosure.

Referring to FIG. 5, illustrated is a method 500 for generating a pattern associated with an IC according to one or more aspects of the present disclosure. The method 500 may be used to generate the patterns 100, 200, 300, and/or 400, described above with reference to FIGS. 1, 2, 3, and 4 respectively.

The method 500 beings at block 502 where a first device is specified. The first device may be specified by a user and/or generated based on performance criteria for an associated IC. The first device may be a gate structure of a transistor; thus, block 502 may include specifying a performance of gate structure and/or a size of the gate structure. In an embodiment, the first device includes a gate structure having a gate area larger than approximately 3 µm².

The method 500 then proceeds to block 504 where a second device is specified. The second device may be specified by a user and/or generated based on performance criteria for an associated IC. The second device may also be a gate structure of a transistor. Block 504 may include specifying a performance of gate structure and/or a size of the gate structure. In an embodiment, the second device includes a gate structure having a gate area larger than approximately 3 µm². The second device may be the next adjacent device to the first device.

The method 500 may continue to include specifying other devices to be included in an IC with the first and second device. These other devices may include gate structures that are smaller than that of the first and/or second device.

The method 500 then proceeds to block 506 where a spacing between the first and second device is determined. The spacing may be determined by implementation of design rules. The spacing determined may be referred to as a poly-to-poly spacing. The design rules may be associated with the fabrication process to be used for the first and/or second device. The design rules for the spacing of the first and second device may include rules based on equations (1) and/or (2), described above with reference to FIG. 3. The design rules may include spacing rules implemented based on the size (e.g., area) of the first and/or second device. For example, select design rules, such as equations (1) and/or (2), may be implemented when a size of a selected device (e.g., gate feature) reaches a certain threshold. In an embodiment, this threshold is approximately 3 µm².

The method 500 then proceeds to block 508 where a pattern is generated including the first and second device having the determined spacing. The pattern generated may be substantially similar to the pattern 100, 200, 300, and/or 400, described above with reference to FIGS. 1, 2, 3, and 4, respectively. The generated pattern may be in a typical layout design file format. In an embodiment, the generated pattern is stored in a library (e.g., cell library) for later use in designing an IC.

The method 500 may proceed to include logic operation procedures including using a design rule check (DRC) and/or other suitable methods. The DRC may include verifying the spacing determined in block 506. In an embodiment, the DRC ensures that the spacing is compliant with the equations (1) and/or (2) described above.

Figure 6:
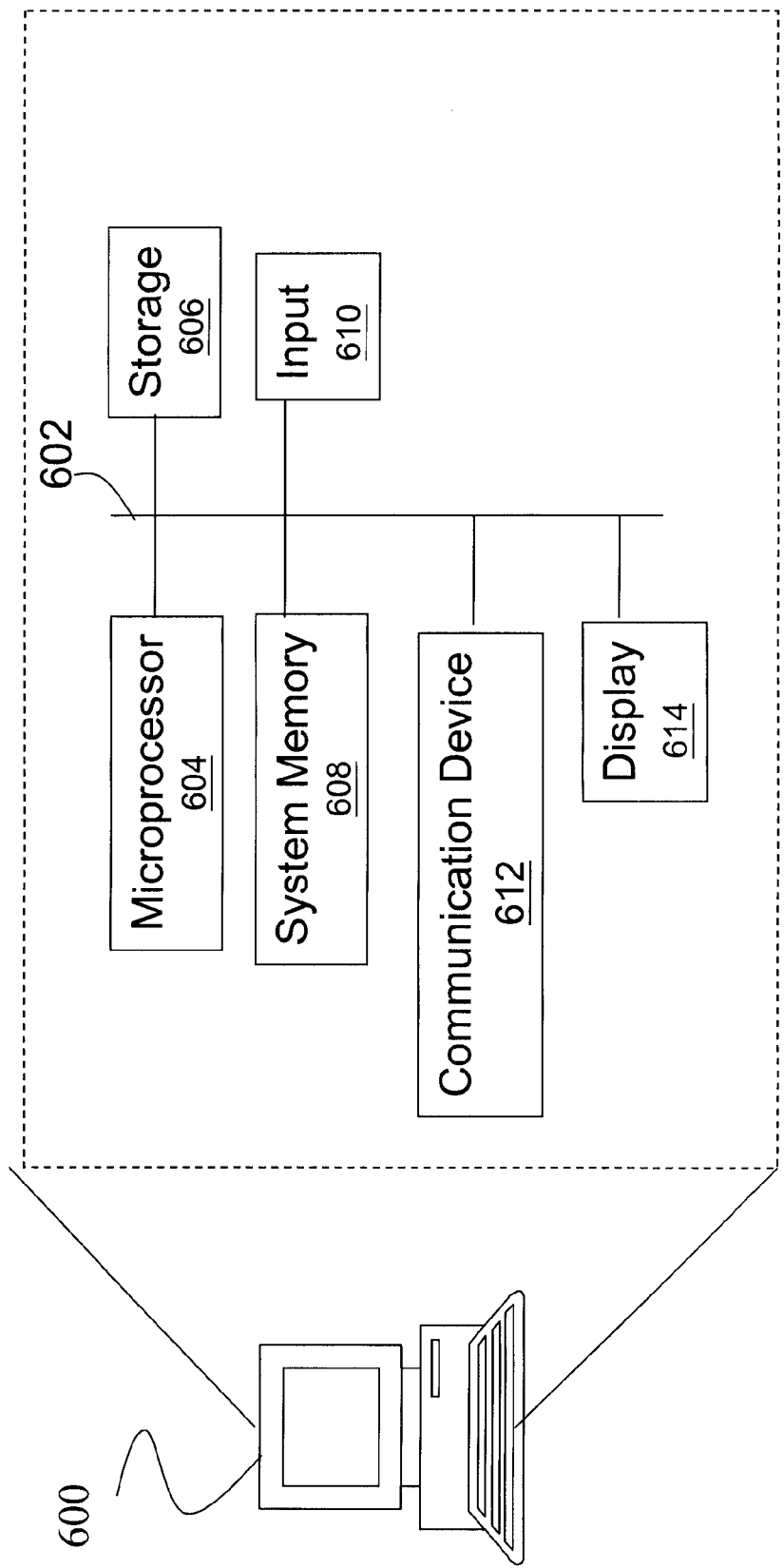
FIG. 6 is an information handling system operable to perform one or more of the aspects of the present disclosure.

One system for providing the disclosed embodiments of the method 500 and/or the patterns 100, 200, 300, and/or 400, described above with reference to FIGS. 1, 2, 3, 4, and 5, respectively, is illustrated in FIG. 6. Illustrated is an embodiment of a computer system 600 for implementing embodiments of the present disclosure including the devices, patterns, and methods described herein. In an embodiment, the computer system 600 includes functionality providing for one or more steps of designing a circuit or chip including performing simulations, verification analysis (e.g., design rule check (DRC), layout versus schematic (LVS)), extraction of parameters, layout, place and route, design for manufacturability (DFM), and/or other suitable tools and/or procedures.

The computer system 600 includes a microprocessor 604, an input device 610, a storage device 606, a system memory 608, a display 614, and a communication device 612 all interconnected by one or more buses 602. The storage device 606 may be a floppy drive, hard drive, CD-ROM, optical device or any other storage device. In addition, the storage device 606 may be capable of receiving a floppy disk, CD-ROM, DVD-ROM, or any other form of computer-readable medium that may contain computer-executable instructions. The communications device 612 may be a modem, a network card, or any other device to enable the computer system to communicate with other nodes. It is understood that any computer system 600 could represent a plurality of interconnected computer systems such as, personal computers, mainframes, PDAs, and telephonic devices.

The computer system 600 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 608 may be configured to store a design database, library, technology files, design rules, PDKs, models, decks, and/or other information used in the design of a semiconductor device. The system memory 608 may store design rules in the form of equations such as equations (1) and/or (2), discussed above, on a tangible medium. The computer system 600 may be further operable to implement the design rules in generating and/or verifying a pattern defined by a user and/or computer system.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 600 may be used to implement one or more of the methods and/or devices described herein. In particular, the computer system 600 may be operable to generate, store, manipulate, and/or perform other actions on a layout pattern (e.g., GDSII file) associated with an integrated circuit. For example, in an embodiment, one or more of the patterns described above may be generated, manipulated, and/or stored using the computer system 600. The patterns provided by the computer system 600 may be in a typical layout design file format which is communicated to one or more other computer systems for use in fabricating photomasks including the defined patterns.

Figure 7:
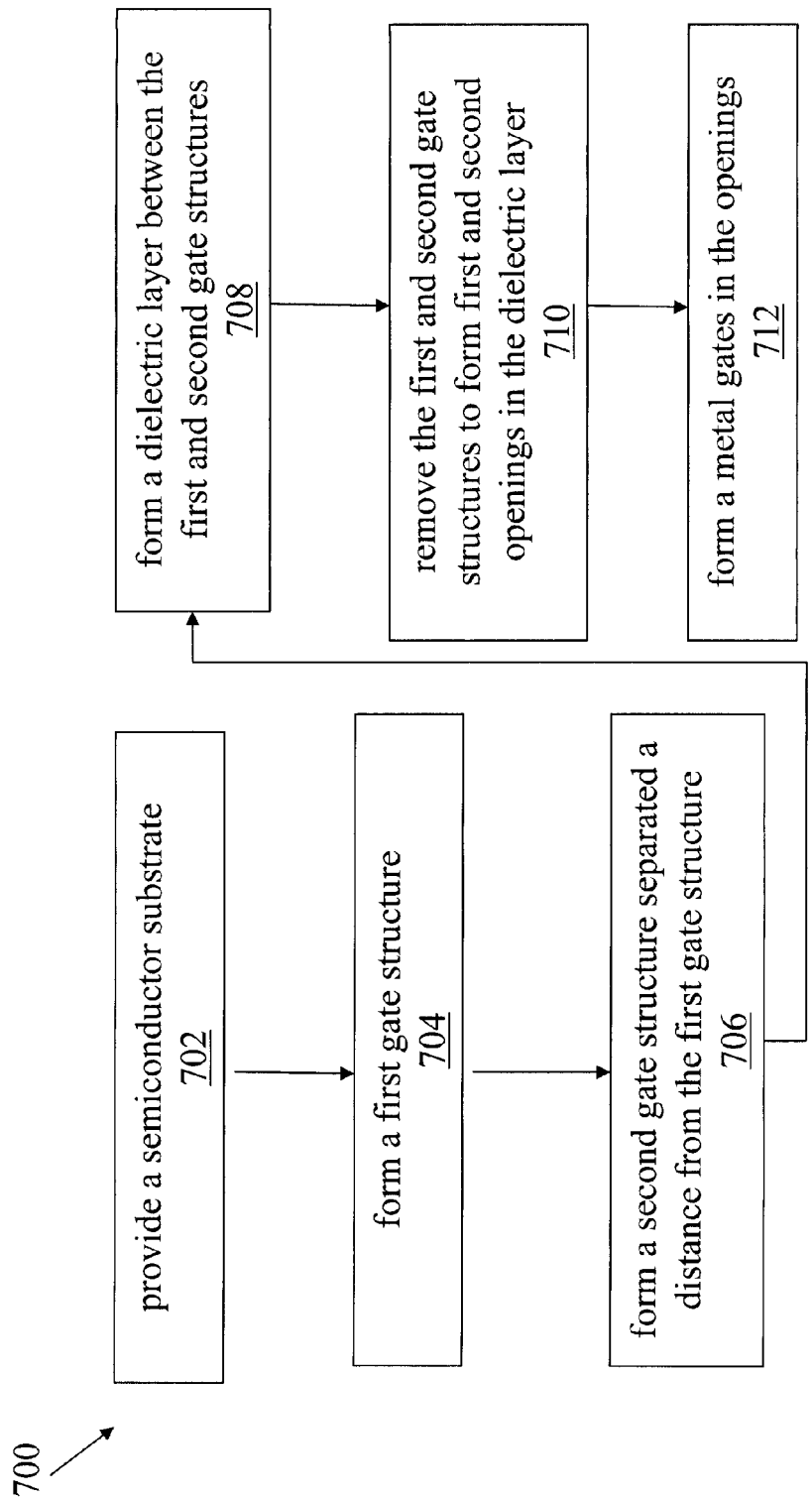
FIG. 7 is a flow chart illustrating an embodiment of a method of fabricating an IC according to one or more aspects of the present disclosure.

Referring now to FIG. 7, illustrated is a method 700 for fabricating a semiconductor device according to one or more aspects of the present disclosure. For example, the method 700 may be used to fabricate the patterns 100, 200, 300, and/or 400 described above with reference to FIGS. 1, 2, 3, and 4, respectively. The method 700 may also be used to generate a semiconductor device including and implementing the pattern generated by the design methodology of the method 500, described above with reference to FIG. 5.

The method 700 begins at block 702 where a semiconductor substrate is provided. The substrate may include silicon. Alternatively, the substrate includes germanium, or includes a compound semiconductor such as, silicon carbide, gallium arsenide, indium arsenide, indium phosphide. Various other substrate materials may be suitable including those typically used in the semiconductor device fabrication processes.

The method 700 then proceeds to block 704 where a first gate structure is formed on the substrate. The first gate structure may be substantially similar to the feature 104, described above with reference to FIGS. 1, 2, 3, and 4. The first gate structure may be a dummy (e.g., sacrificial) gate structure. The first gate structure may be formed of polysilicon, though other embodiments are possible. In an embodiment, the first gate structure has an area larger than approximately 3 $\mu m^2$. The first gate structure may be formed using deposition processes, photolithography processes, etching processes, and other suitable processes typical of semiconductor fabrication.

The method 700 then proceeds to block 106 where a second gate structure is formed on the substrate. Typically, block 106 and block 104 of the method 700 may be performed simultaneously. The second gate structure may be substantially similar to the feature 106, described above with reference to FIGS. 1, 2, 3, and 4. The second gate structure may also be a dummy (e.g., sacrificial) gate structure. The second gate structure may be formed of polysilicon, though other embodiments are possible. In an embodiment, the second gate structure has an area larger than approximately 3 $\mu m^2$. The second gate structure may be formed using deposition processes, photolithography processes, etching processes, and other suitable processes typical of semiconductor fabrication.

The first and second gate structures are formed such that they are disposed a distance from each other on the substrate. The distance may be determined using the method 500, described above with reference to FIG. 5. The distance may be less than or approximately equal to 500 nm. In an embodiment, the distance greater than approximately the square root of $(W^2+L^2)$, divided by 10. W and L define the dimensions of the first and/or second gate structure. The second gate structure may be the next adjacent gate structure to the first gate structure.

The method 700 may further include forming other gate structures on the semiconductor substrate of the same or different size than the first and second gate structures. In an embodiment, the method 700 includes forming one or more additional gate structures of less than approximately 3 $\mu m^2$ on the substrate provided in block 702. In an embodiment, an additional gate structure (e.g., that of less than 3 $\mu m^2$) is formed adjacent at least one of the first and second gate structure. For example, the additional gate structure (e.g., that of less than 3 $\mu m^2$) may be the next adjacent gate structure to the first gate structure. The additional gate structure may be spaced between approximately 100 nm and approximately 200 nm from the first or second gate structure. The additional gate structure may also be a sacrificial gate structures (e.g., polysilicon gates of a replacement gate process).

The method 700 then proceeds to block 708 where a dielectric layer is formed between and around the first and second gate structure. The dielectric layer may be an interlayer dielectric (ILD). The ILD layer may be formed by chemical vapor deposition (CVD), high density plasma CVD, spin-on methods, sputtering, and/or other suitable methods. Example compositions of the ILD layer include silicon oxide, silicon oxynitride, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In an embodiment, the ILD layer is a high density plasma (HDP) dielectric.

The method 700 then proceeds to block 710 where the first and second gate structures are removed from the substrate. The removal of the first and second gate structures provides openings in the dielectric layer, described above with reference to block 708. In embodiments, additional sacrificial (dummy) gate structures are also removed from the substrate. The gate structures may be removed using suitable wet or dry etchants. In an embodiment, a gate dielectric layer is also removed.

The method 700 then proceeds to block 712 where a metal gate is formed in the openings provided in block 710. The formation of the metal gate may include forming interfacial layers, gate dielectric layers, work function layers, fill layers, and/or other layers typical of a metal gate structure. Exemplary materials included in the metal gate include work function metals such as, TiN, TaN, $ZrSi_2$, $MoSi_2$, $TaSi_2$, $NiSi_2$, WN, and/or other suitable material. The work function metal(s) may be deposited by CVD, PVD, and/or other suitable processes. Exemplary materials included in the metal gate include fill metals such as, Al, W, or Cu, and/or other suitable material. The fill metal layer(s) may be formed by CVD, PVD, plating, or other suitable process. Exemplary materials included in the gate include gate dielectric layers such as, high-k dielectric materials including hafnium oxide ($HfO_2$), $TiO_2$, HfZrO, $Ta_2O_3$, $HfSiO_2$, $ZrO_2$, $ZrSiO_2$, combinations thereof, and/or other suitable dielectric materials. The gate dielectric layer may be formed by atomic layer deposition (ALD) and/or other suitable methods. Furthermore, additional layers may be formed in or on the metal gate electrode such as, for example, capping layers. The deposition of one or more of the layers of the metal gate structure may be followed by chemical mechanical polish (CMP) process to planarize the substrate and remove the metal-gate material(s) and/or gate dielectric (e.g., high-k material) formed on the surface of the ILD layer. The CMP process may benefit from the spacing provided between the first and second gate structures, for example, providing adequate loading such that dishing of the gate structures is reduced. Further suitable CMOS processes may be performed such as, for example, formation contacts and a multiple-layer interconnect (MLI) structure.

In summary, the methods and devices disclosed herein provide for embodiments that lend themselves to improved planarity after CMP processing, for example, in a replacement gate process. In doing so, the present disclosure offers several advantages over prior art devices. Advantages of the present disclosure include the ability to include large devices (e.g., with larger gate sizes) on a substrate without suffering from CMP dishing affects that may result from the loading affects. The large devices are spaced such that a region of dielectric (e.g., ILD) lies adjacent at least one side of the gate of the large device, which may improve the loading affects for CMP processing. It is understood that different embodiments disclosed herein offer different disclosure, and that they may make various changes, substitutions and alterations herein without departing from the spirit and scope of the present disclosure.

What is claimed is:

1. A method of integrated circuit fabrication, comprising:
   forming a first gate structure having a width (W) and a length (L), wherein W and L are provided in a unit of microns;
   forming a second gate structure separated a distance from a first side of the first gate structure, wherein the distance of separation is greater than:

$$\frac{\sqrt{W*W + L*L}}{10}$$

and wherein the second gate structure is the next adjacent gate structure to the first side of the first gate structure, and wherein the distance of separation is defined by a length of a line drawn from the first side of the gate structure to the second gate structure, wherein the line is substantially parallel to an end of the gate structure of length L.

2. The method of claim 1, wherein the distance of separation is less than approximately 500 nm.

3. The method of claim 1, wherein the distance of separation is determined by a design rule associated with the IC fabrication.

4. The method of claim 1, wherein the first gate structure has an area of greater than approximately 3 $\mu m^2$.

5. The method of claim 1, further comprising:
   forming a third gate structure, wherein the third gate structure has an area of less than approximately 3 $\mu m^2$, and wherein the first gate structure and the second gate structure have an area of greater than approximately 3 $\mu m^2$.

6. The method of claim 1, wherein the first gate structure and the second gate structure include polysilicon.

7. The method of claim 6, wherein the first gate structure and the second gate structure are sacrificial gate structures.

8. The method of claim 1, further comprising:
   forming a dielectric layer between the first gate structure and the second gate structure;
   removing the first gate structure and the second gate structure to form a first and second opening in the dielectric layer; and
   forming a metal gate structure in each of the first and second openings.

9. The method of claim 8, wherein the forming the metal gate includes:
   forming a layer of high-k dielectric in the first and second opening;
   forming a layer of metal in the first and second opening; and
   performing a chemical mechanical polishing (CMP) process of the layer of metal.

10. A method of integrated circuit fabrication, comprising:
    receiving a pattern defining a first gate structure and a second gate structure wherein at least one of the first and second gate structures have a width (W) and a length (L), wherein W and L are provided in a unit of microns;
    performing a design rule check on the pattern, wherein the design rule check requires a distance of separation between the first and second gate structures is greater than:

$$\frac{\sqrt{W*W + L*L}}{10}$$

and wherein the second gate structure is the next adjacent gate structure to the first side of the first gate structure, and wherein the distance of separation is defined by a length of a line drawn from the first side of the gate structure to the second gate structure, wherein the line is substantially parallel to an end of the gate structure of length L; and
    modifying the pattern to comply with the distance of separation to form a modified pattern; and
    fabricating the modified pattern on a semiconductor substrate.

11. The method of claim 10, wherein the distance of separation is less than approximately 500 nm.

12. The method of claim 10, wherein the first gate structure is defined by L and W, and wherein the product of L and W is greater than approximately 3 $\mu m^2$.

13. The method of claim 10, wherein the modified pattern further defines a third gate structure spaced a distance from the second gate structure, wherein the third gate structure has an area of less than approximately 3 $\mu m^2$, and wherein the first gate structure and the second gate structure have an area of greater than approximately 3 $\mu m^2$.

14. The method of claim 10, wherein the fabricating the modified pattern includes forming the first gate structure and the second gate structure using polysilicon.

15. A method of integrated circuit fabrication, comprising:
    forming a first gate structure having a width (W) and a length (L), wherein W * L is greater than approximately 3 microns;

forming a second gate structure separated a distance of separation from a closest side of the first gate structure, wherein the distance of separation is greater than:

$$\frac{\sqrt{W*W + L*L}}{10}$$

and wherein the second gate structure is the next adjacent gate structure to the closest side of the first gate structure, wherein the distance of separation is defined by a length of a line drawn from the first side of the gate structure to the second gate structure, wherein the line is substantially parallel to an end of the gate structure of length L; and wherein the distance of separation is less than approximately 500 nanometers.

16. The method of claim 15, further comprising:
forming a third gate structure spaced a second distance from the second gate structure, wherein the third gate structure has an area of less than approximately 3 $\mu m^2$.

17. The method of claim 16, wherein the second distance is less than the distance of separation.

18. The method of claim 16, wherein the second distance is between approximately 100 nanometers (nm) and approximately 200 nm.

* * * * *